United States Patent [19]
Kohiyama et al.

[11] Patent Number: 5,220,529
[45] Date of Patent: Jun. 15, 1993

[54] ONE-CHIP FIRST-IN FIRST-OUT MEMORY DEVICE HAVING MATCHED WRITE AND READ OPERATIONS

[75] Inventors: Kiyoshi Kohiyama; Hidenaga Takahashi, both of Tokyo; Yukio Otobe, Kawasaki, all of Japan

[73] Assignee: Fujitsu Limited, Kawasaki, Japan

[21] Appl. No.: 747,047

[22] Filed: Aug. 19, 1991

[30] Foreign Application Priority Data

Aug. 20, 1990 [JP] Japan .................................. 2-218611
Aug. 20, 1990 [JP] Japan .................................. 2-218613

[51] Int. Cl.⁵ ............................................. G11C 13/00
[52] U.S. Cl. .................. 365/189.01; 365/78; 365/189.04
[58] Field of Search ................ 365/78, 189.01, 189.04, 365/201, 221, 233

[56] References Cited

U.S. PATENT DOCUMENTS 4,866,0255 8/1989 Shimohigashi et al. ........ 365/189.01

OTHER PUBLICATIONS

Texas Instruments Catalog: 1M Bit Field Memory TMS4C1050, May, 1987, pp. 2-37-2-48.

Primary Examiner—Terrell W. Fears
Attorney, Agent, or Firm—Nikaido, Marmelstein, Murray & Oram

[57] ABSTRACT

A write operation is performed by using a sequentially-incremented write address upon a first-in first-out memory device, and a read operation is performed by using a sequentially-incremented read address upon the first-in first-out memory device. The write address is cleared by a write reset signal, and the read address is cleared by a read reset signal. A delay circuit is provided to coincide an effective timing of the write reset signal in the memory cell array with that of the read reset signal in the memory cell array.

11 Claims, 14 Drawing Sheets

PRIOR ART

Fig. 7A CLK
Fig. 7B RSTR
Fig. 7C SEL2
Fig. 7D ADDR_R
Fig. 7E 39A
Fig. 7F 39B
Fig. 7G D_OUT

Fig. 15A RSTW
Fig. 15B WE
Fig. 15C RSTR
Fig. 15D D_IN
Fig. 15E D_OUT 5,220,529

ONE-CHIP FIRST-IN FIRST-OUT MEMORY DEVICE HAVING MATCHED WRITE AND READ OPERATIONS

BACKGROUND OF THE INVENTION

1) Field of the Invention

The present invention relates to a one-chip first-in first-out (FIFO) memory device used in a digital television and a video tape recorder, and the like.

2) Description of the Related Art

In a digital television and a video tape recorder, and the like, a one-chip FIFO memory device is provided as a frame memory, to carry out an image processing and a stationary image processing, and the like.

In a prior art FIFO memory device, a write operation is carried out by using a sequentially-incremented write address, and a read operation is carried out by using a sequentially-incremented read address. Also, the write address is reset (cleared) by a write reset signal RSTW, and the read address is reset (cleared) by a read reset signal RSTR.

In the above-mentioned prior art FIFO memory device, however, if the write reset signal is the same as the read reset signal, the write operation is not synchronized with the read operation, since the speed of a read operation is substantially lower than that of a write operation. Accordingly, an external delay circuit must be connected to the FIFO memory device, to thus increase the cost of manufacturing the device, as will be later explained in detail.

In another prior art FIFO memory device, a special write buffer register and a special read buffer register are provided (Texas Instruments 1M bit Field Memory TMS4C1050). In this prior art, when a write reset signal RSTW is input to the device, a first series of data for a definite number of clock pulses (such as 4 clock pulses) are written into the special write buffer register. Thereafter, the other data are written via a write shift register into a memory cell array, and simultaneously, the data of the special write buffer register is transferred to the special read buffer register. On the other hand, when a read reset signal RSTR is input to the device, data is read out of the memory cell array to a read shift register. In this case, however, to compensate for a long read time, the data of the special read buffer register is first read out, and thereafter, the above-mentioned data of the memory cell array is read via the read shift register. Thus, this prior art requires complex special buffer registers, which increase the manufacturing cost.

SUMMARY OF THE INVENTION

Therefore, an object of the present invention is to provide a simple one-chip FIFO memory device in which an effective timing of a write operation is coincided with that of a read operation even when a write reset signal is the same as a read reset signal.

According to the present invention, a delay circuit is incorporated into the one-chip FIFO memory device to thereby adjust an effective timing of a write reset signal or a read reset signal. Namely, the effective timing of the write reset signal at which an effective write operation is initiated is coincided with that of the read reset signal at which an effective read operation is initiated.

BRIEF DESCRIPTION OF THE DRAWINGS

The present invention will be more clearly understood from the description as set forth below, with reference to the accompanying drawings, wherein.

DESCRIPTION OF THE PREFERRED EMBODIMENTS

Before the description of embodiments of the present invention, the prior art devices will be explained.

Figure 1:
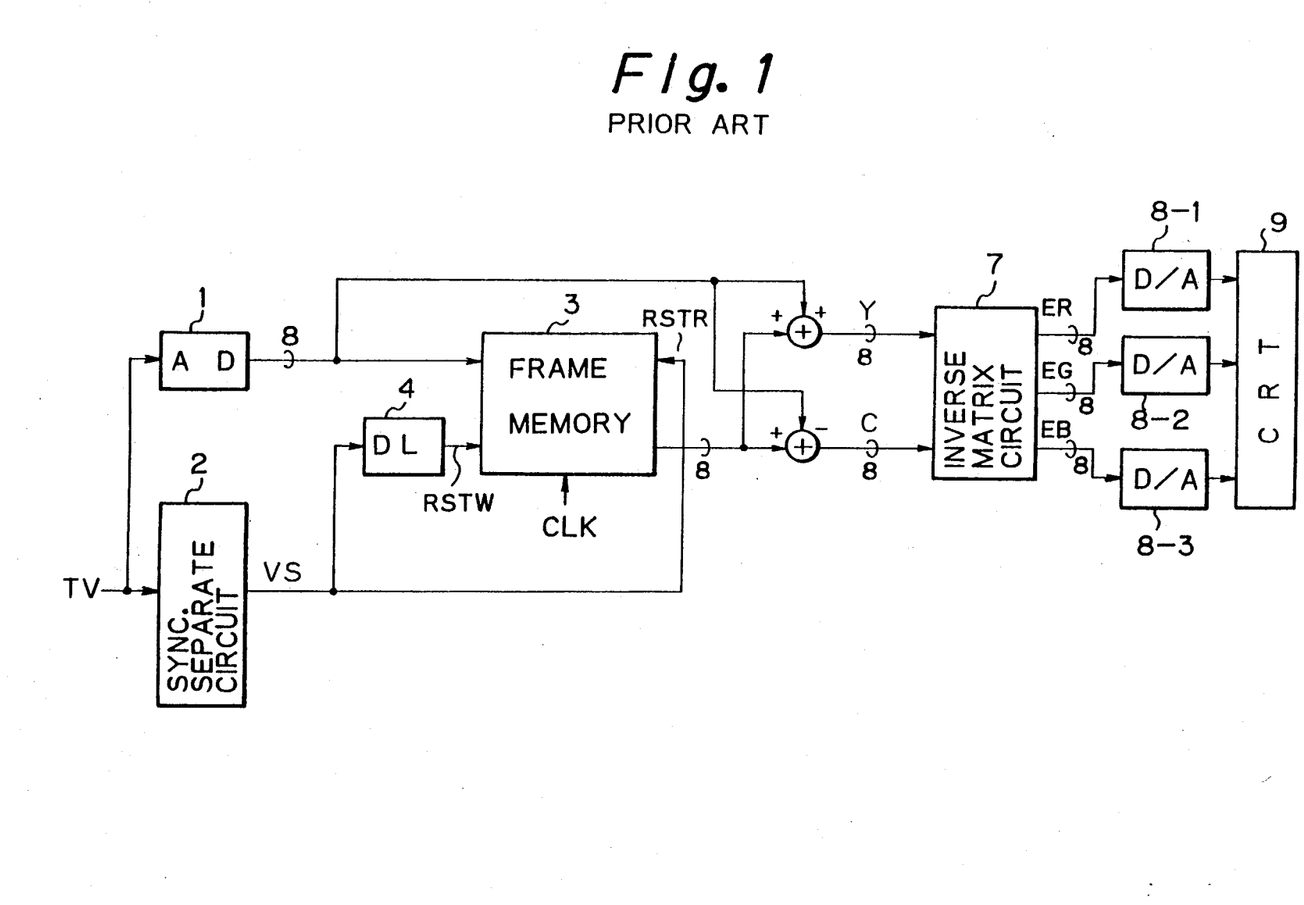
FIG. 1 is a block circuit diagram illustrating a National Television Systems Committee (NTSC) system's receiver.

In FIG. 1, which illustrates a NTSC system's receiver, reference numeral 1 designates an analog/digital (A/D) converter for converting an image analog data signal TV into a digital signal such as an 8-bit digital signal, and 2 designates a synchronization separating circuit for detecting a horizontal synchronization signal HS and a vertical synchronization signal VS, and the like.

Reference numeral 3 designates a frame memory formed by an FIFO memory device for storing data of one screen. A write operation is performed by using a write address $ADD_W$ upon the frame memory 3, and a read operation is performed by using a read address $ADD_R$ upon the frame memory 3. The write address $ADD_W$ is incremented by receiving a clock signal CLK and is reset (cleared) by a write reset signal RSTW, and the read address $ADD_R$ is incremented by receiving the clock signal CLK and is reset (cleared) by a read reset signal RSTR. Both of the write reset signal RSTW and the read reset signal RSTR are generated by using the vertical synchronization signal VS, but the write reset signal RSTW is delayed by a delay circuit 4, compared with the read reset signal RSTR, thereby coinciding an effective time of a write operation with that of a read operation.

Reference numerals 5 and 6 designates operation units for performing an image processing of the image data. For example, the operation unit 5 calculates a brightness signal Y by adding previous image data to current image data, and the operation unit 6 calculates a color signal C by subtracting the current image data from the previous image data. Also, reference numeral 7 designates an inverse matrix operation circuit for calculating red, green, and blue signals ER, EG, and EB which are converted, by D/A converters 8-1, 8-2, and 8-3 into analog signals, and are transmitted to a CRT 9.

Figure 2:
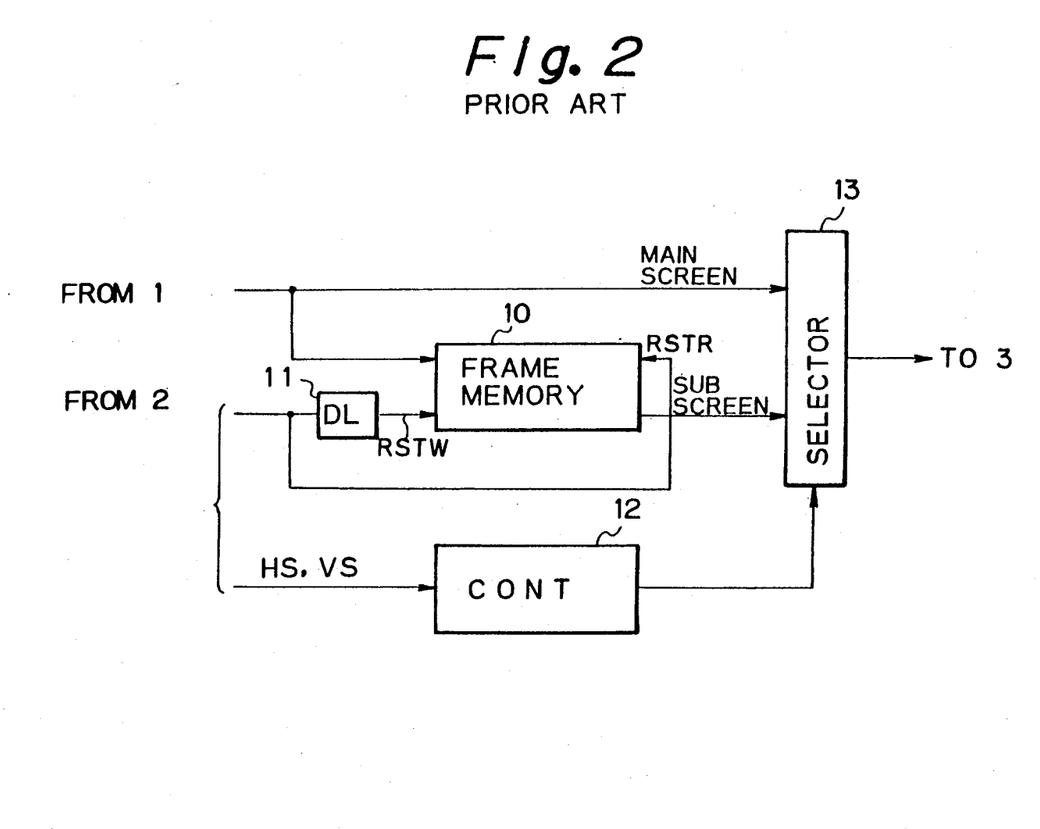
FIG. 2 is a block circuit diagram illustrating a part of the NTSC receiver.

Also, in FIG. 2, which illustrates a part of the NTSC system's receiver, a sub screen smaller than a main screen is introduced into the main screen. For this purpose, elements 10 through 13 are provided between the A/D converter 1 (the synchronization separating circuit 2) and the frame memory 3 (including the delay circuit 4). That is, reference numeral 10 designates a frame memory 10 formed by an FIFO memory device, a delay circuit 11, a control circuit 12, and a selector 13. The control circuit 12 operates the selector 13 so that a sub screen defined by the frame memory 10 is introduced into the main screen. In this case, the frame memory 10 and the delay circuit 11 are similar to the frame memory 3 and the delay circuit 4, respectively, of FIG. 1. Therefore, also in the frame memory 10, an effective timing of a write reset signal RSTW is coincided with that of a read reset signal RSTR.

Figure 3:
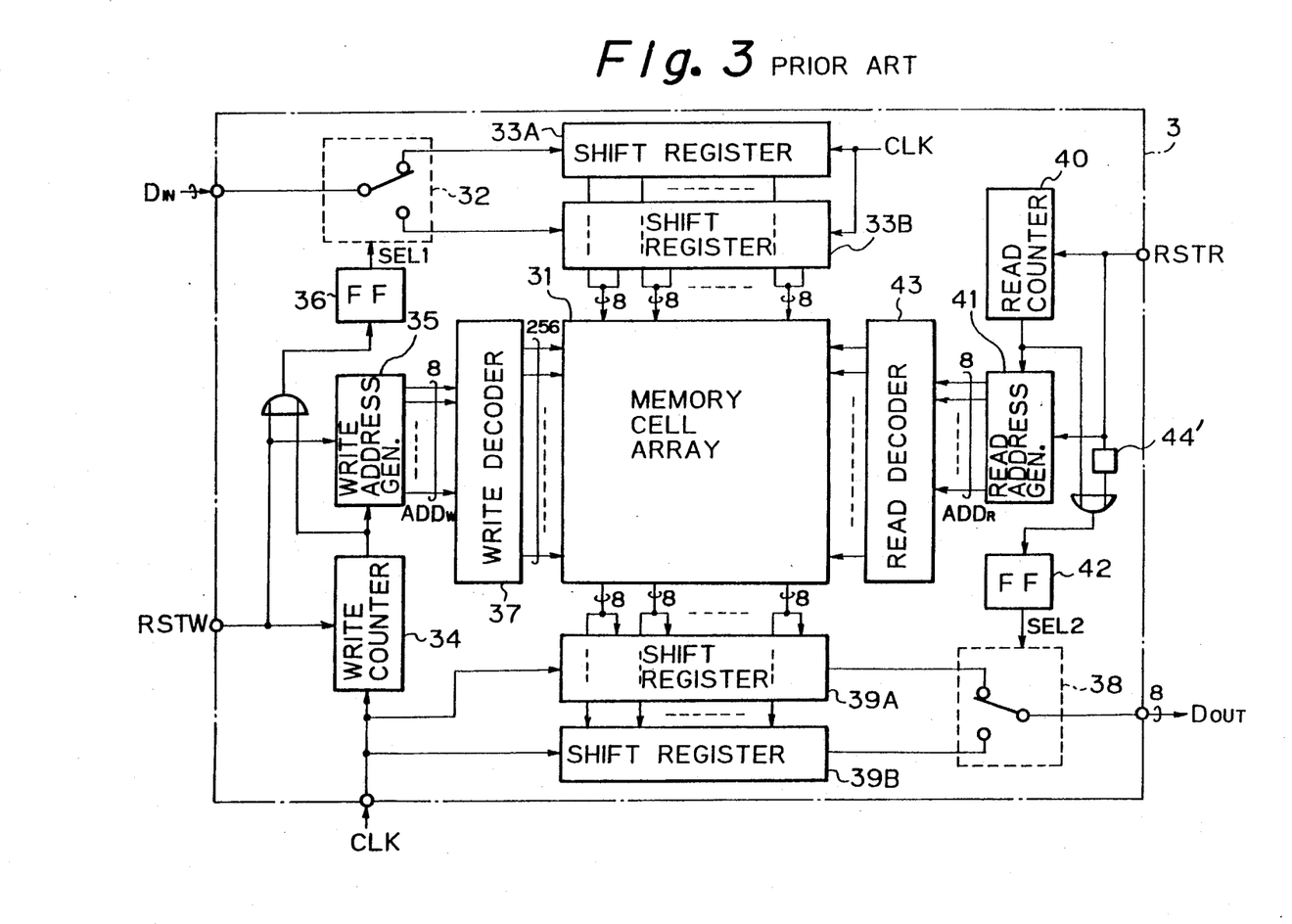
FIG. 3 is a block circuit diagram illustrating a prior art one-chip FIFO memory device.

In FIG. 3, which is a detailed circuit diagram of the frame memory 3 (or 10) of FIG. 1, reference numeral 31 designates a memory cell array having a capacity of 66536 bits (= 256 rows × 8 bits × 32 pixels), 32 designates a selector for selecting one of shift registers 33A and 33B each of which has 32 pixels (= 32×8 bits).

Reference numeral 34 designates a 32-ary write counter which counts a clock signal CLK and is reset (cleared) by the write reset signal RSTW, and 35 designates a write address generating circuit which counts a carry-out signal of the 32-ary write counter 34. The write address generating circuit 35 is also cleared by the write reset signal RSTW. For example, the write address generating circuit 35 generates an 8-bit output.

A JK flip-flop 36 is inverted by receiving each carry-out signal of the write counter 34, and as a result the selector 32 is inverted to alternatingly select the shift registers 33A and 33B.

Similarly, reference numeral 38 designates a selector for selecting one of shift registers 39A and 39B each of which has 32 pixels (=32×8 bits).

Reference numeral 40 designates a 32-ary read counter which counts the clock signal CLK and is reset (cleared) by the read reset signal RSTR, and 41 designates a write address generating circuit which counts a carry-out signal of the 32-ary read counter 40. The address generating 41 is also cleared by the write reset signal RSTR. For example, the read address generating circuit 41 generates an 8-bit output.

A JK flip-flop 42 is inverted by receiving each carry-out signal of the read counter 40, and as a result the selector is inverted to alternatingly select the shift registers 39A and 39B.

Reference numeral 44' designates a delay circuit for delaying the read reset signal RST by four pulses of the clock signal CLK. As a result, the JK flip-flop 42 is also inverted by a delayed signal of the read reset signal RSTR.

Figure 4:
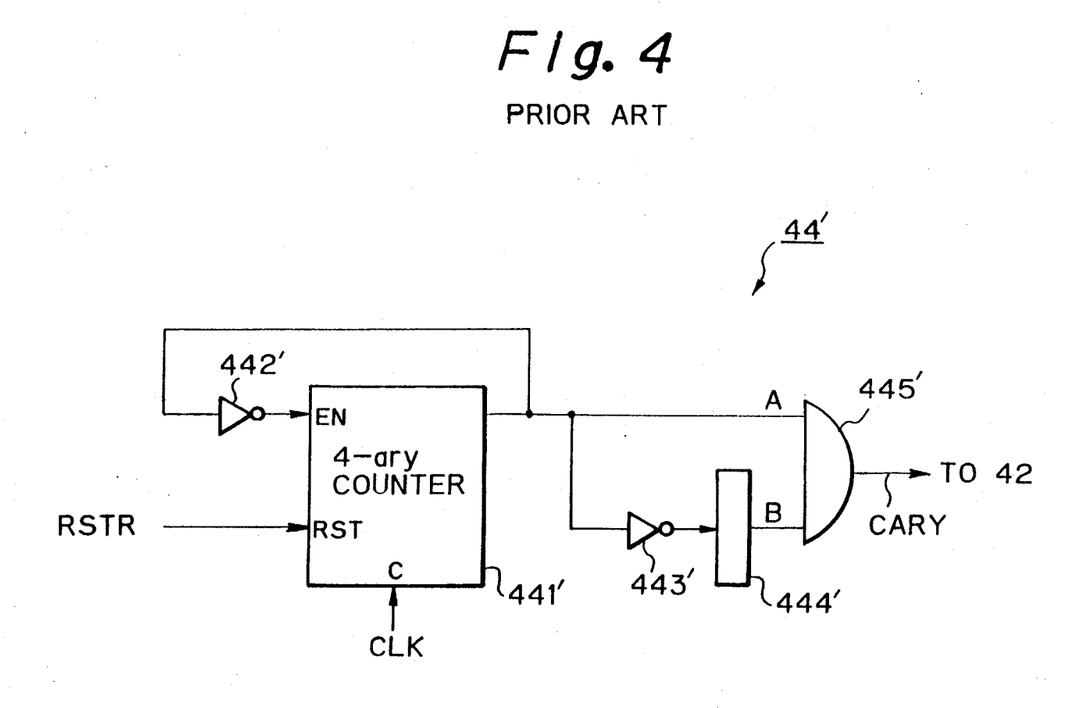
FIG. 4 is a detailed circuit diagram of the delay circuit of FIG. 3.

As illustrated in FIG. 4, the delay circuit 44' includes a 4-ary counter 441', an inverter 442', an inverter 443', a register 444', and an AND circuit 445'. Note that the inverter 443', the register 444', and the AND circuit 445' as a whole form a differential circuit.

The operation of the delay circuit 44' of FIG. 4 is explained with reference to FIGS. 5A through 5G.

Figure 5A:
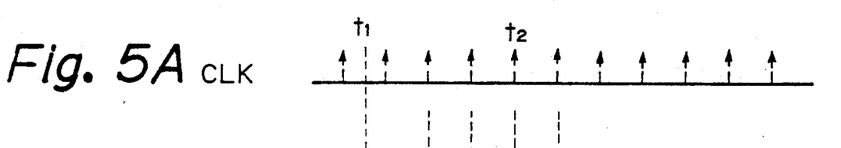
FIGS. 5A through 5G are timing diagrams showing the operation of the circuit of FIG. 4.
Figure 5B:
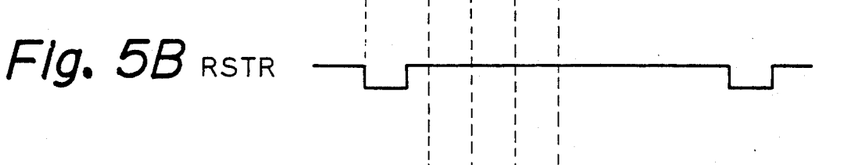
Figure 5C:
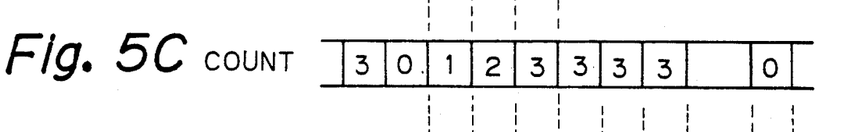
Figure 5D:
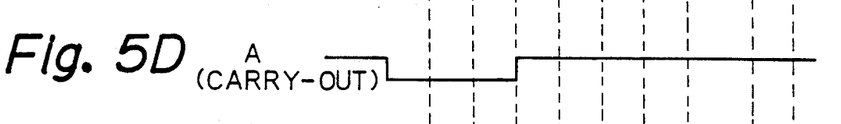
Figure 5E:
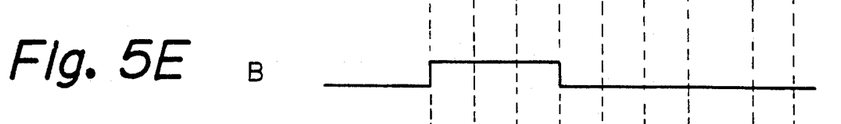
Figure 5F:
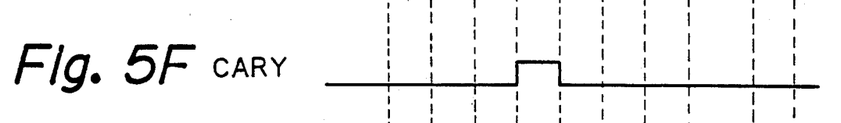
Figure 5G:
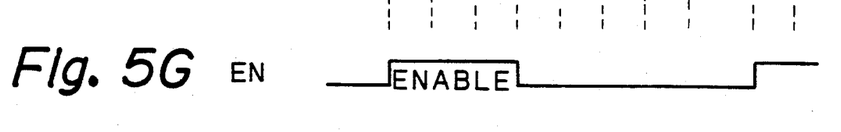

At a time $t_1$, when the read reset signal RSTR is made low ("0") as shown in FIG. 5B, the 4-ary counter 441' counts up the clock signal CLK as shown in FIGS. 5A and 5C. Then, at a time $t_2$, when the 4-ary counter 441' generates a carry-out signal A as shown in FIG. 5D, the 4-ary counter 441, stops its operation by an enable signal EN (="0") as shown in FIG. 5G. Also, a signal B obtained by the inverter 443, and the register 444' as shown in FIG. 5E is supplied with the signal A to the AND circuit 445', and as a result, a signal CARY as shown in FIG. 5F is obtained. The signal CARY is a delay signal of the read reset signal RSTR.

The write operation of the device of FIG. 3 will be explained with reference to FIGS. 6A through 6H.

Figures 6A, 6B, 6C:
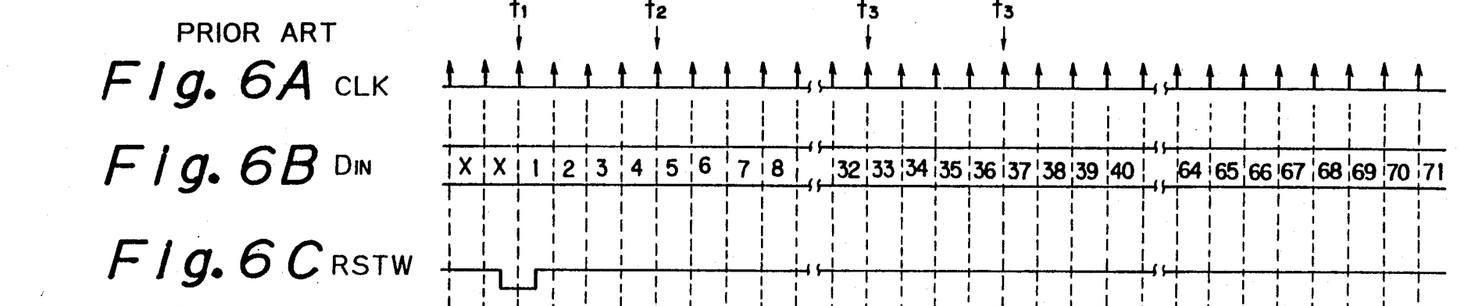
FIGS. 6A through 6H are timing diagrams showing a write operation of the device of FIG. 3.
Figures 6D, 6E:
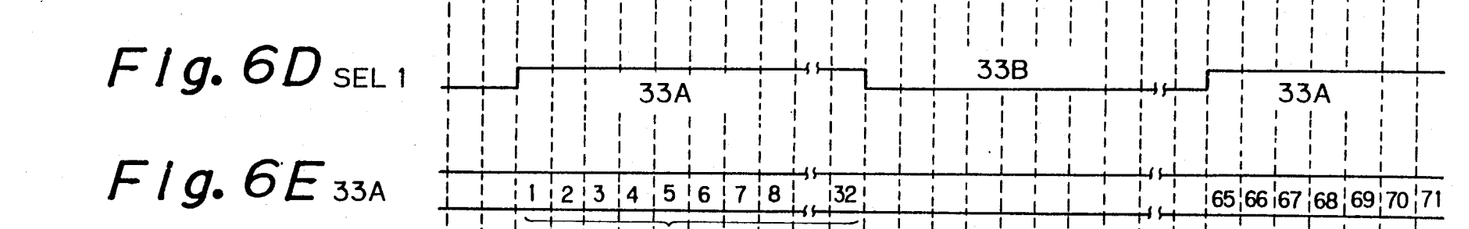
Figure 6F:
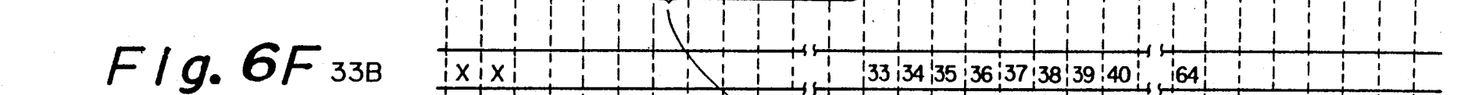

Before a time $t_1$, the output SEL 1 of the JK flip-flop 36 is low ("0") as shown in FIG. 6D, and as a result, the selector 32 selects the shift register 33B.

Figure 6G:
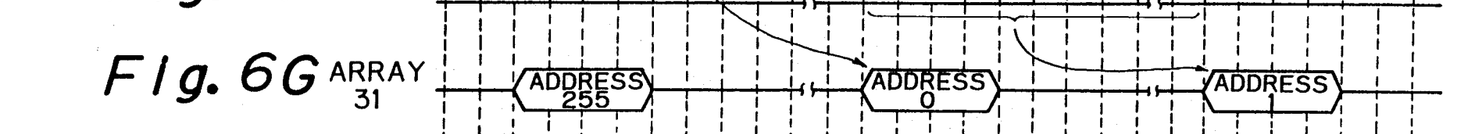

Next, at a time $t_1$, when a write reset signal RSTW is made low ("0"), as shown in FIG. 6C, the write counter 34 is cleared and is counted up by receiving the clock signal CLK, as shown in FIG. 6A. As a result, input image data is written into the shift register 33A in synchronization with the clock signal CLK. Also, the data previously stored in the shift register 33B is written into a portion of the memory cell array 31 indicated by address 255 (final address), as shown in FIG. 6G.

Figure 6H:
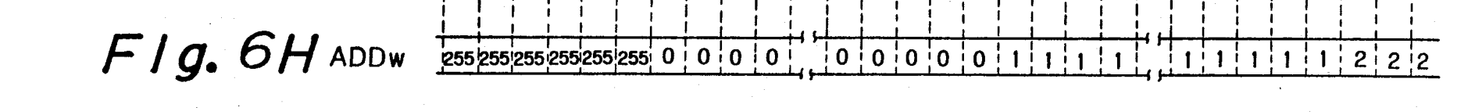

At a time $t_2$, the write address generating circuit 35 is reset (cleared) to generate a write address 0, as shown in FIG. 6H. Note that the operation of the write address generating circuit 35 is delayed by four pulses of the clock signal CLK.

At a time $t_3$, when 32 pixels of input image data $D_{IN}$ are written into the shift register 33A, the write counter 34 generates a carry-out signal, thereby inverting the output SEL 1 of the JK flip-flop 36, as shown in FIG. 6D. As a result, the selector 32 selects the shift register 33B, and therefore, input image data $D_{IN}$ is written into the shift register 33B, as shown in FIG. 6B. Also, at time $t_3$, the previously stored input image data $D_{IN}$ in the shift register 33A is written into a portion of the memory cell array 31 indicated by address "0", as shown in FIG. 6G.

Also, at a time $t_3$, the write counter 34 generates a carry-out signal and transmits it to the write address generating circuit 35. As a result, at a time $t_4$, after four pulses of the clock signal CLK are generated, the write address $ADD_W$ of the write address generating circuit 35 is changed from "0" to "1", as shown in FIG. 6H, thereby enabling a write operation upon a portion of the memory cell array 31 indicated by address "1".

The ready operation of the device of FIG. 3 will be explained with reference to FIGS. 7A through 7G.

Figure 7A:
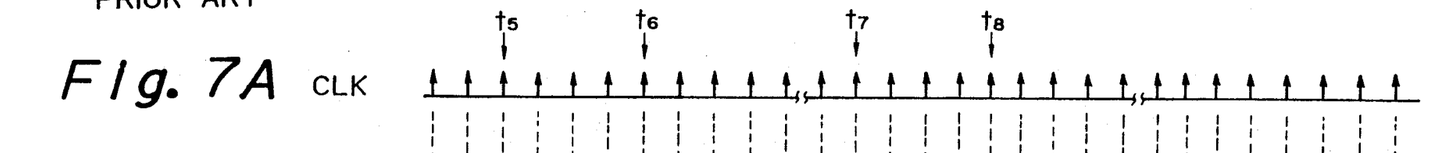
FIGS. 7A through 7G are timing diagrams showing a read operation of the device of FIG. 3.
Figure 7B:
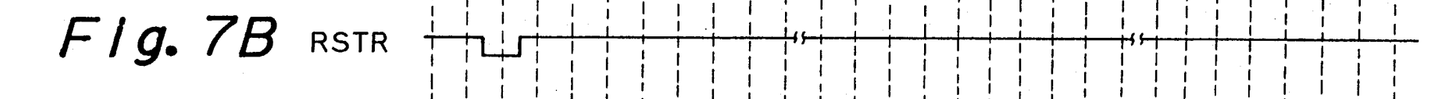
Figure 7C:
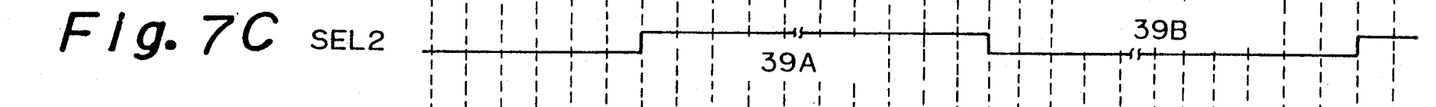

Before a time $t_5$, the output SEL 2 of the JK flip-flop 42 is low ("0") as shown in FIG. 7C, and as a result, the selector 38 selects the shift register 39B.

Figure 7D:
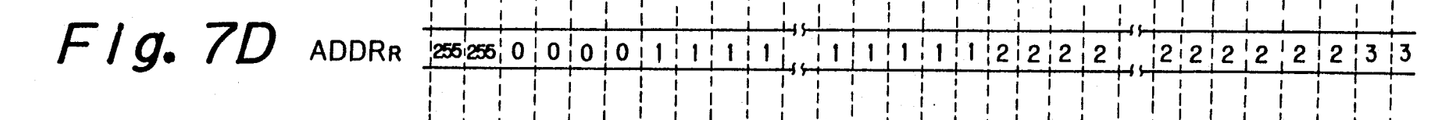
Figure 7E:
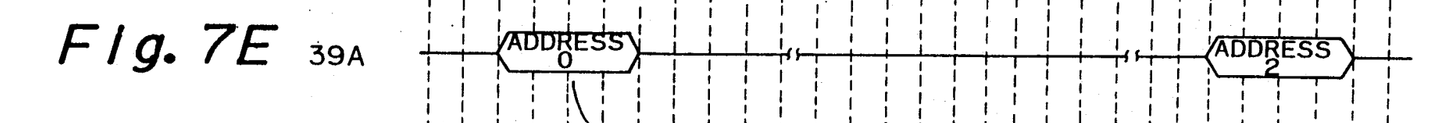

Next, at the time $t_5$, when a read reset signal RSTR is made low ("0"), as shown in FIG. 5B, the read address generating circuit 41 is cleared to generate a read address $ADD_R$ (= "0") as shown in FIG. 7D. As a result, the data stored in a portion of the memory cell array 31 indicated by address "0" is written into the shift register 39A as shown in FIG. 7E.

Also, at a time $t_6$, when four pulses of the clock signal CLK are generated, the output SEL 2 of the JK flip-flop 42 is inverted due to a delay circuit 44; as shown in FIG. 7C. As a result, the selector 38 selects the shift register 39A, and therefore, the image data of the shift register 39A is output as output image data $D_{OUT}$ as shown in FIG. 7G.

Also, at the time $t_6$, the read address generating circuit 41 generates a read address $ADD_R$ ($=$"1") as shown in FIG. 7D, thereby enabling a read operation upon a portion of the memory cell array 31 indicated by address "1".

Figure 7F:
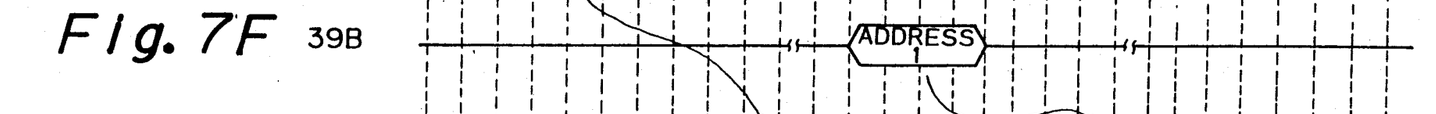
Figure 7G:
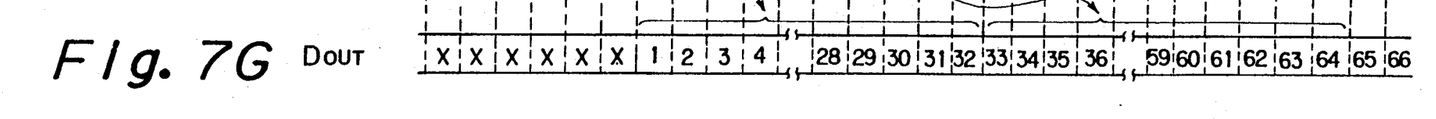

At a time $t_7$, the content of the memory cell array 31 indicated by address "1" is written into the shift register 39B as shown in FIG. 7F.

Thereafter, at a time $t_8$, when a read operation of the data stored in the shift register 39A is completed, the output SEL 2 of the JK flip-flop 42 is changed as shown in FIG. 7C, thus enabling a read operation upon the shift register 39B.

As explained above, when a write reset signal RSTW is supplied to the one-chip FIFO memory device 3, a write operation is promptly performed upon the shift register 33A or 33B, i.e., a write operation is carried out simultaneously with a write reset signal RSTW. On the other hand, when a read reset signal RSTR is supplied to the one-chip FIFO memory device 3, an image data $D_{OUT}$ is obtained at the output terminals thereof with a delay time such as a time corresponding to four pulses of the clock signal CLK. Namely, a read operation can be carried out after four pulses of the clock signal CLK are generated after the generation of a read reset signal RSTR, and thus an effective timing of the read reset signal RSTR is delayed, compared with that of the write reset signal RSTW. To coincide these timings with each other, the delay circuit 4 of FIG. 1 or the delay circuit 11 of FIG. 2 is provided outside of the prior art one-chip FIFO memory device. Therefore, to manufacture the circuits of FIGS. 1 and 2, the delay circuits 4 and 10 must be designed to match the timings of the write and read reset signals with each other, which thereby increases the manufacturing cost.

Figure 8:
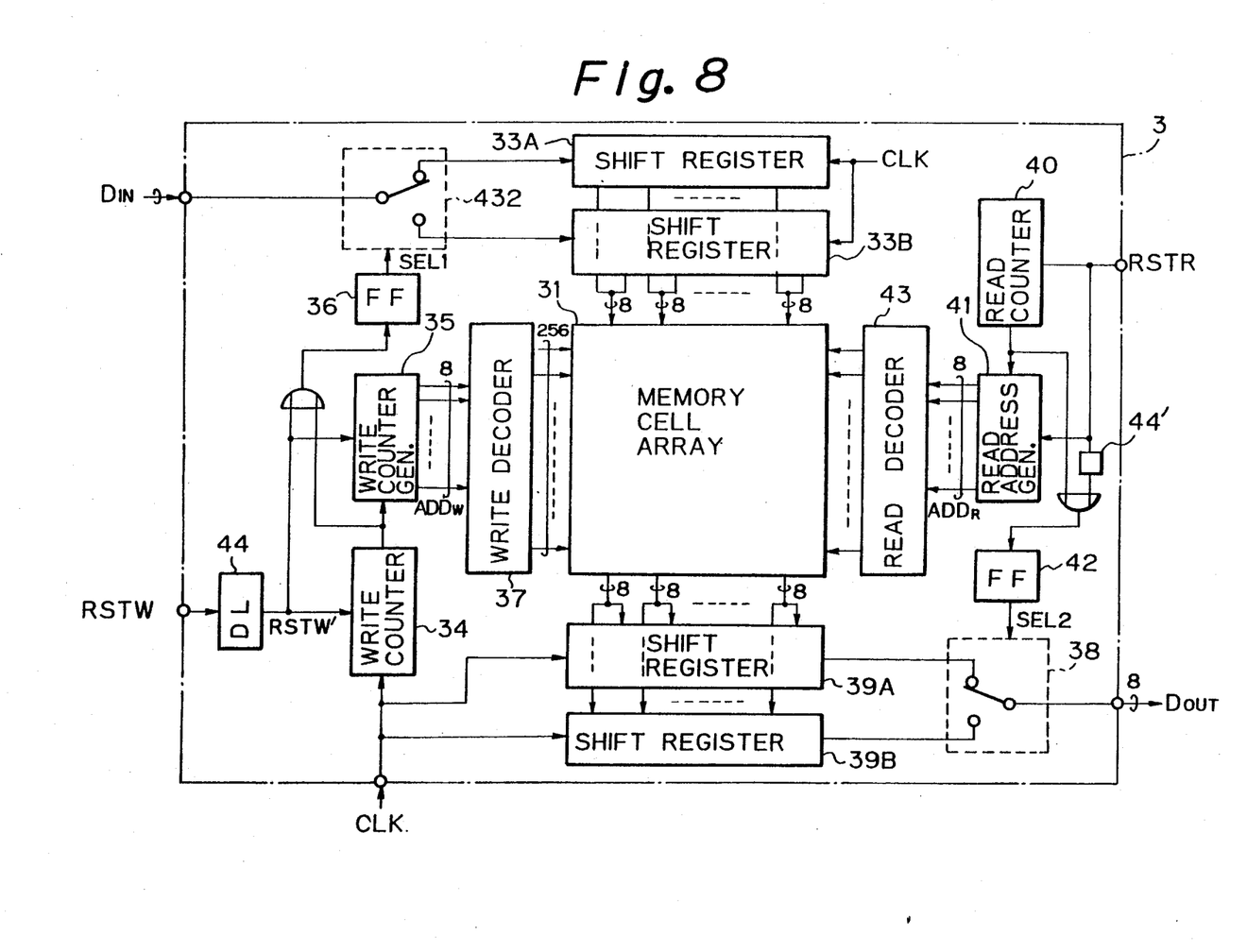
FIG. 8 is a block circuit diagram illustrating a first embodiment of the one-chip FIFO memory device according to the present invention.

In FIG. 8, which illustrates a first embodiment of the present invention, a delay circuit 44 is added to the elements of FIG. 3. The delay circuit 44 is formed by a circuit as illustrated in FIG. 9 or 11.

Figure 9:
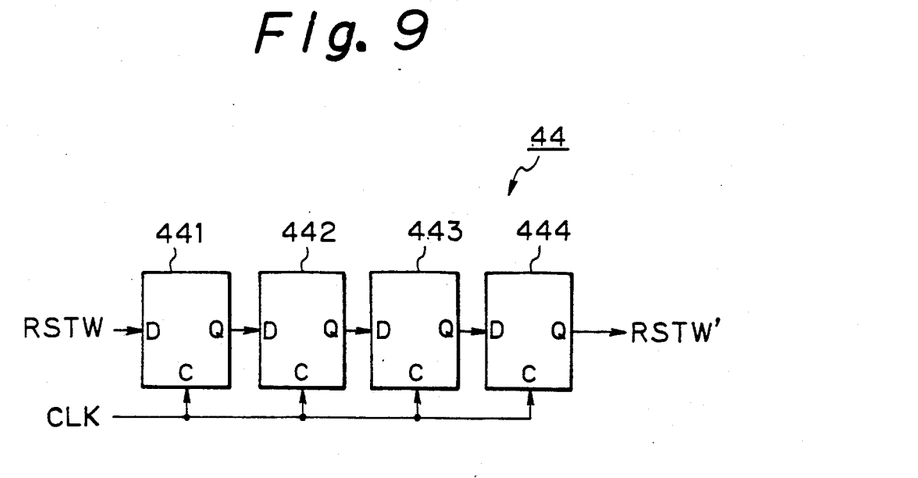
FIG. 9 is a block circuit diagram illustrating an example of the delay circuit of FIG. 8.
Figure 10A:
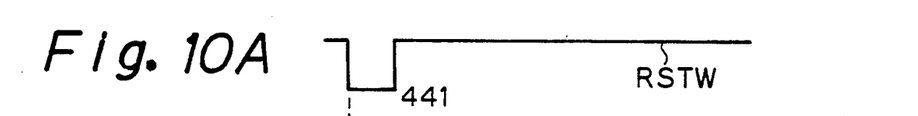
FIGS. 10A through 10E are timing diagrams showing the operation of the delay circuit of FIG. 9.
Figure 10B:
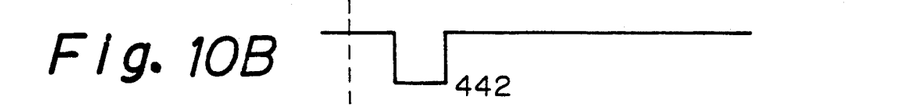
Figure 10C:
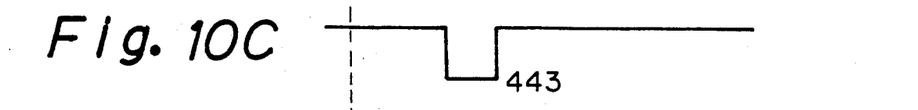
Figure 10D:
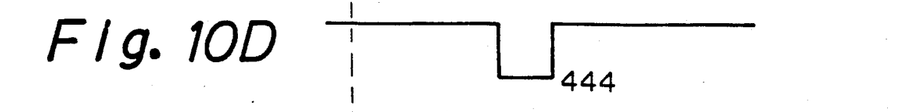
Figure 10E:
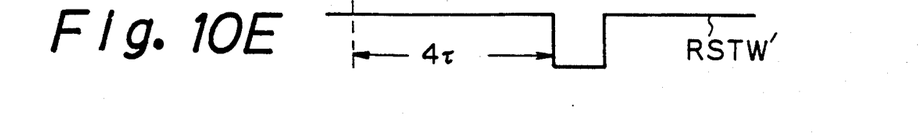

In FIG. 9, the delay circuit 44 includes four D flip-flops 441 through 444 connected in series. All of the D flip-flops are clocked by the clock signal CLK. The write reset signal RSTW is supplied to a data input of the first stage of the D flip-flops. As shown in FIGS. 10A through 10E, the write reset signal RSTW is delayed by 4, where , is a period of the clock signal CLK.

Figure 11:
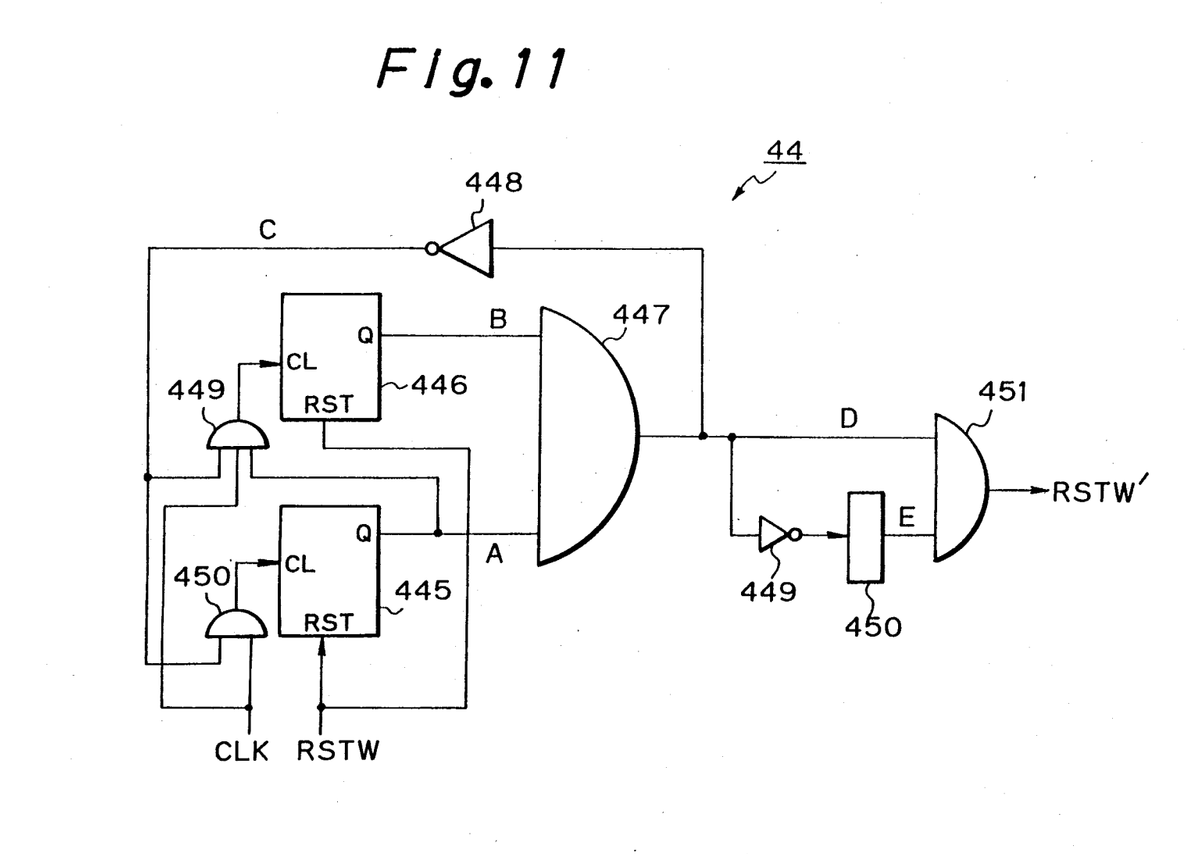
FIG. 11 is a block circuit diagram illustrating another example of the delay circuit of FIG. 8.

In FIG. 11, the delay circuit 44 includes JK flip-flops 445 and 446, an AND circuit 447, an inverter 448, inverter 449, a register 450, and an AND circuit 451. The inverter 449, the register 450, and the AND circuit 451 as a whole form a differential circuit. This delay circuit 44 serves as a n-ary counter (n=4) and therefore, a delayed write reset signal RSTW' is a carry-out signal of the n-ary counter.

Figure 12A:
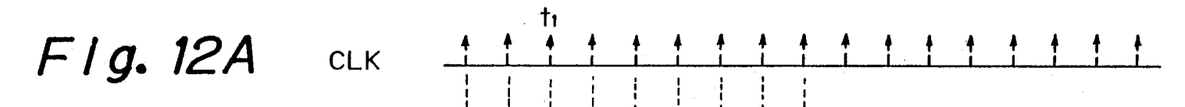
FIGS. 12A through 12H are timing diagrams showing the operation of the circuit of FIG. 11.
Figure 12B:
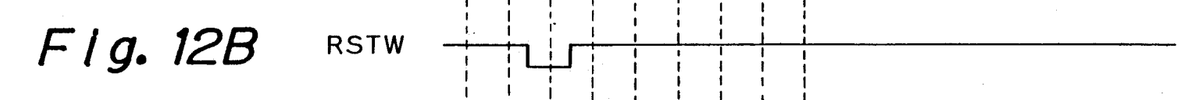
Figure 12C:
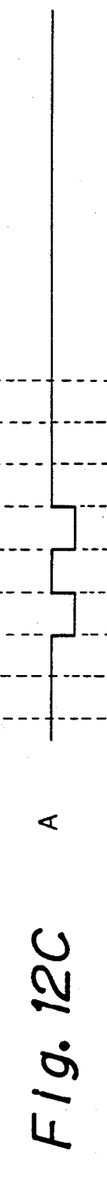
Figure 12D:
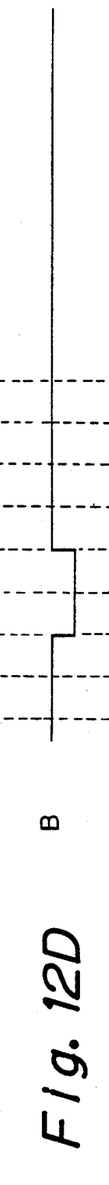
Figure 12E:
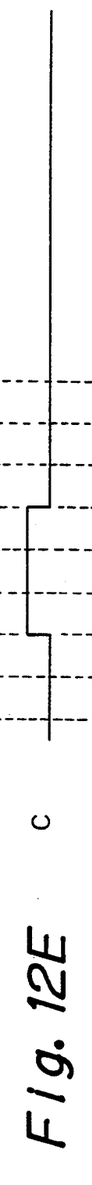
Figure 12F:
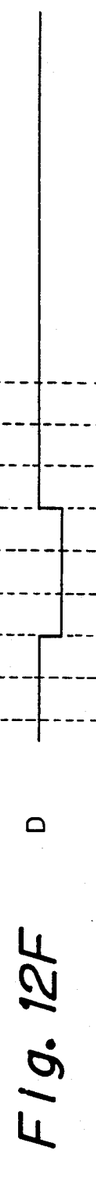
Figure 12G:
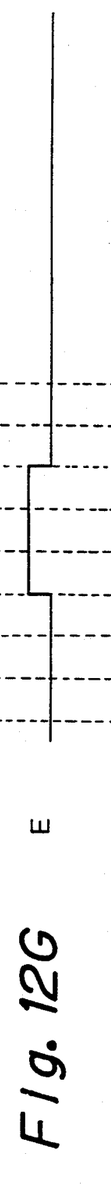
Figure 12H:
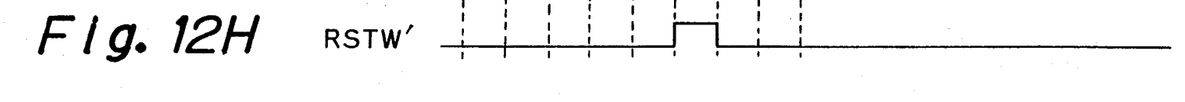

The operation of the delay circuit 44 of FIG. 11 is explained with reference to FIGS. 12A through 12H. When the write reset signal is made low ("0") as shown in FIG. 12B, the output A of JK flip-flop 445 is changed in response to the clock signal CLK of FIG. 12A, as shown in FIG. 12C, and as a result, the output B of the JK flip-flop 446 is changed in response to the clock signal CLK, as shown in FIG. 12E. Thus, the output D of the AND circuit 447 and the signal C thereof inverted by the inverter 448 are obtained as shown in FIGS. 12F and 12E. Also, the output E of the register 450 is obtained as shown in FIG. 12G, and thus an output of the AND circuit 451, i.e., a delayed write reset signal RSTW' is obtained as shown in FIG. 12H.

Figure 13A:
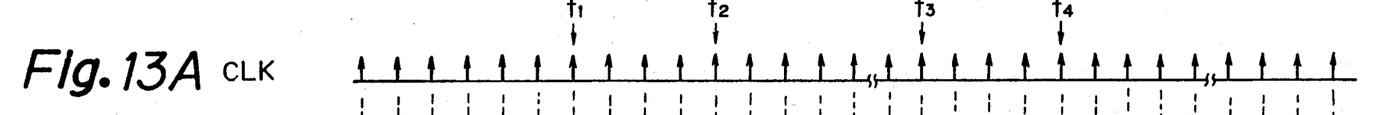
FIGS. 13A through 13I are timing diagrams showing a write operation of the device of FIG. 8.
Figure 13B:
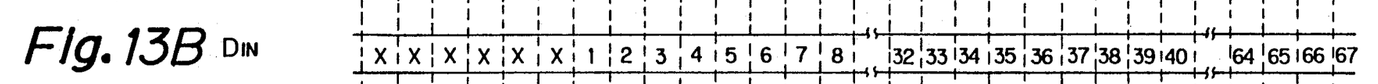
Figure 13C:
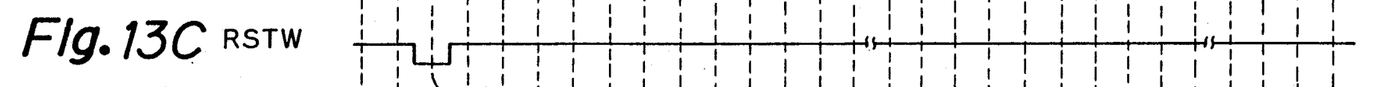
Figure 13D:
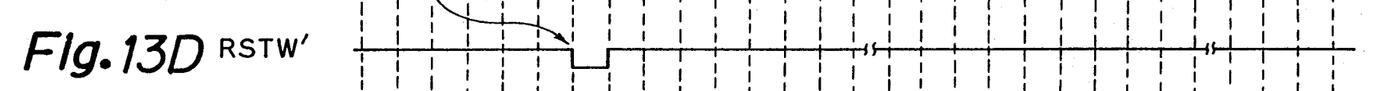
Figure 13E:
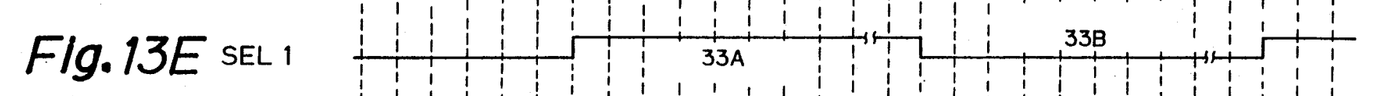
Figure 13F:
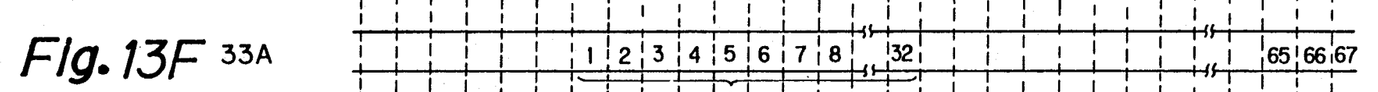
Figure 13G:
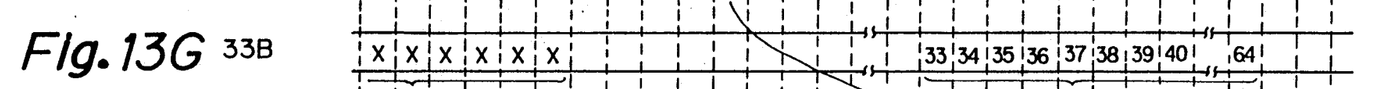
Figures 13H, 13I:
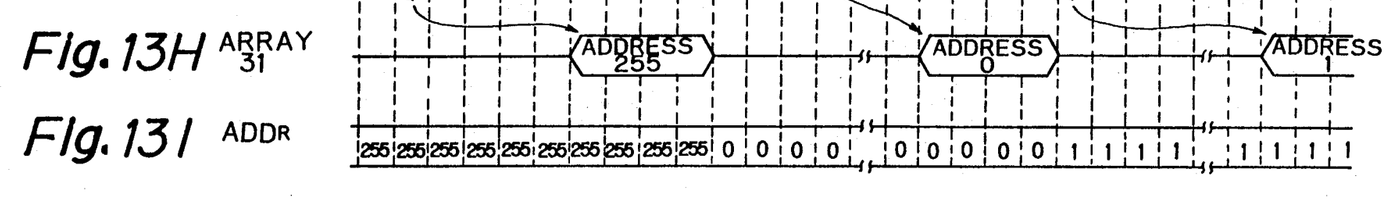

The write operation of the device of FIG. 8 is shown in FIGS. 13A through 13I. FIGS. 13A, 13B, 13D through 13I correspond to FIGS. 6A through 6H, respectively. Namely, as shown in FIGS. 13C and 13D, the delayed write reset signal RSTW' is obtained by delaying the write reset signal RSTW by a time $4\tau$. Thus, a write operation upon the shift register 33A is initiated after a time $4\tau$ has passed from the input of the write reset reset signal RSTW, and an output data $D_{OUT}$ is obtained at the output terminals after a time $4\tau$ has passed from the input of the read reset signal RSTR. Therefore, if the read reset signal RSTR is the same as the write reset signal RSTW, an effective timing of the write reset signal RSTW coincides with that of the read reset signal RSTR.

Figure 14:
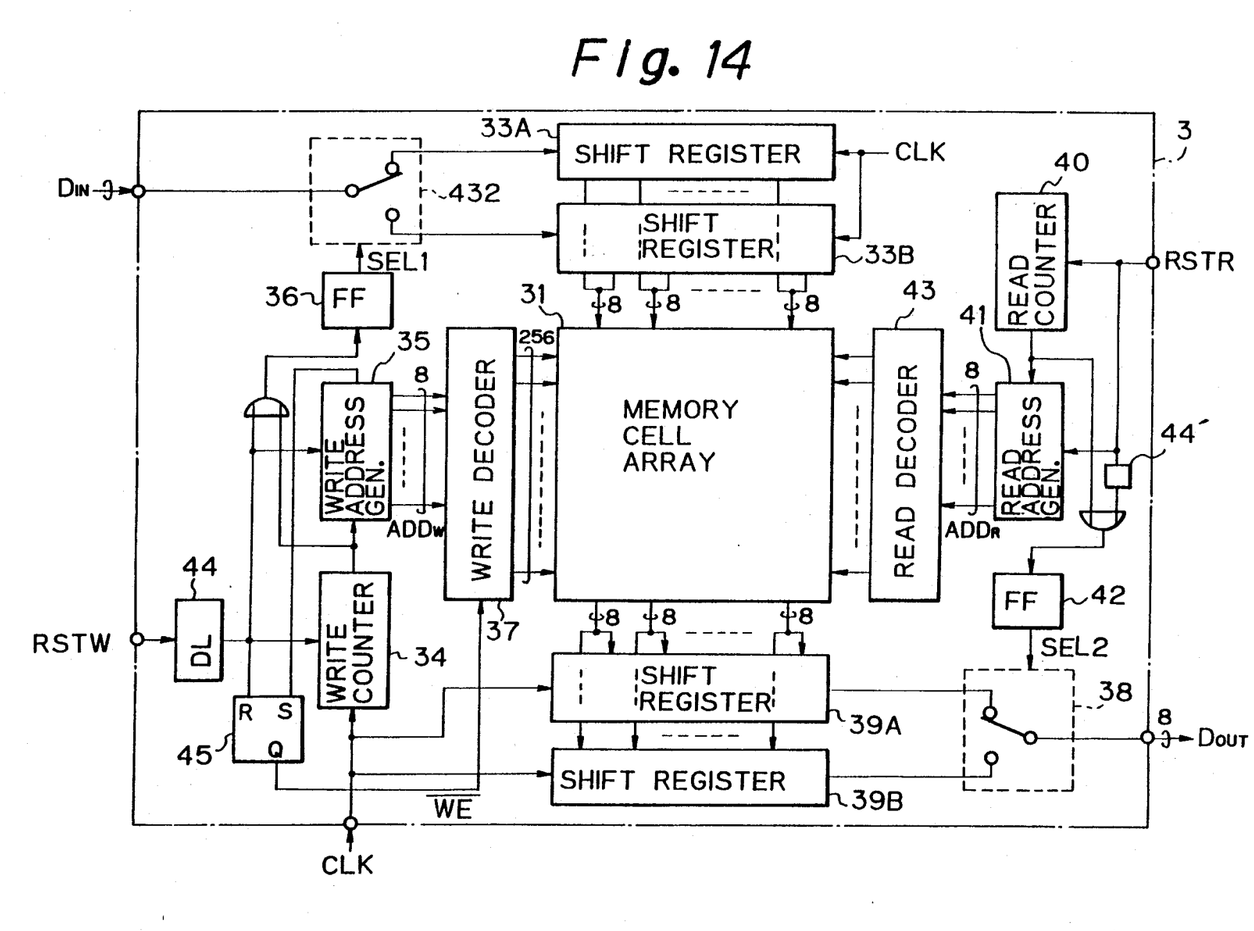
FIG. 14 is a block circuit diagram illustrating a second embodiment of the one-chip FIFO memory device according to the present invention.

In FIG. 14, which illustrates a second embodiment of the present invention, an RS flip-flop 45 is added to the elements of the device of FIG. 8. Namely, the output RSTW' of the delay circuit 44 is supplied to a reset input of the RS flip-flop 45, and a carry-out signal of the write address generating circuit 35 is supplied to a set input of the RS flip-flop 45. This RS flip-flop 45 generates a write enable signal $\overline{WE0}$ and transmits it to the write decoder 37. If the write enable signal $\overline{WE0}$ is high ("1"), the write decoder 37 is disabled so that a write operation is not carried out, and if the write enable signal $\overline{WE0}$ is low ("0"), the write decoder 37 is enabled to carry out a write operation. This RS flip-flop 45 is used for displaying a stationary screen. Note, in the device of FIG. 11, the write reset signal RSTW (RSTW') is independent of the read reset signal RSTR.

The operation of the device of FIG. 14 will be explained with reference to FIGS. 15A through 15E.

Figure 15A:
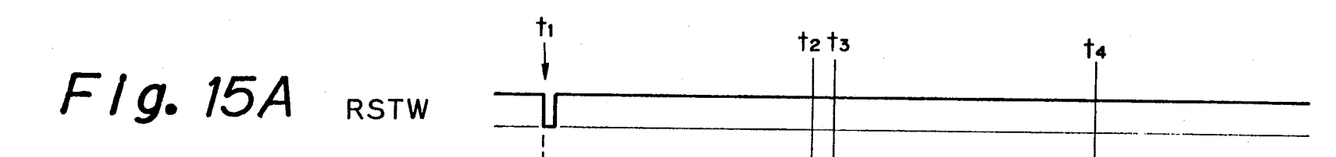
FIGS. 15A through 15E are timing diagrams showing the operation of the device of FIG. 14.
Figure 15B:
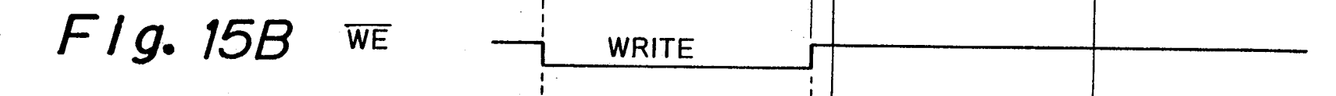
Figure 15C:
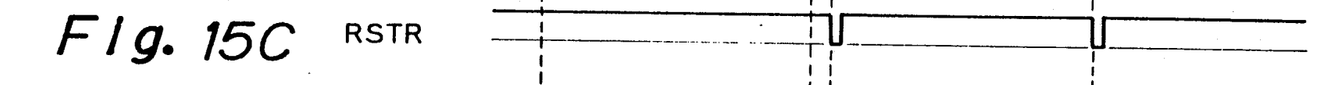
Figures 15D, 15E:
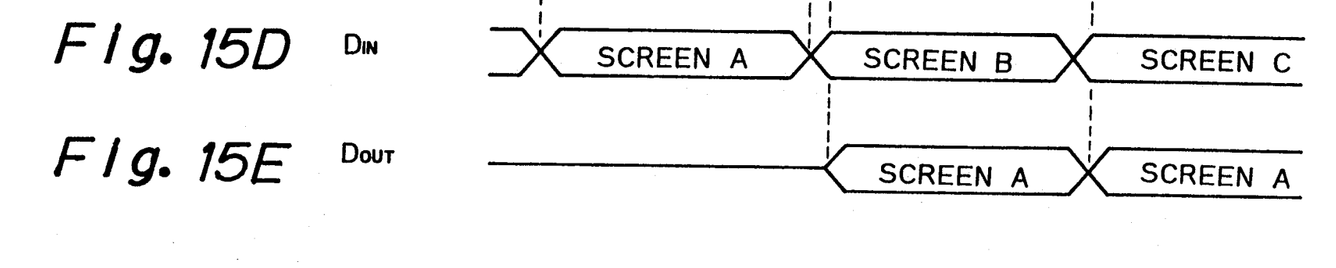

At a time $t_1$, when the write reset signal RSTW (RSTW') is made low ("0") as shown in FIG. 15A, the RS flip-flop 45 is reset to generate a write enable signal $\overline{WE0}$ ($=$"0"), to thereby enable a write operation of a field. As a result, an image data $D_{IN}$ for a screen A is written via the shift registers 33A and 33B into the memory cell array 31, as shown in FIG. 15D.

At a time $t_2$, when a write operation for the screen A is completed, the write address generating circuit 35 generates a carry-out signal. As a result, the RS flip-flop 45 is reset, and therefore, a write operation is disabled ($\overline{WE}$="1"), as shown in FIG. 12B. Thus, after the time $t_2$, even when image data for screens B, C, ... are written into the shift registers 33A and 33B, such image data is not written into the memory cell array 31.

Thereafter, at times $t_3$ and $t_4$, even when a read reset signal RSTR is supplied to the device of FIG. 14, the same data for the screen A is read out of the shift registers 39A and 39B. This means that the screen A is stationary.

Thus, in the device of FIG. 14, a stationary screen can be obtained without a special external terminal for the write enable signal $\overline{WE}$. If such a special external terminal is provided, the same elements as the write counter 34 and the write address generating circuit 35 must be also externally provided, which increases the manufacturing cost.

In the above-mentioned embodiments, the delay circuit 44 is provided for the write reset signal RSTW, but if an effective timing of the write reset signal RSTW is delayed, compared with that of the read reset signal RSTR, such a delay circuit can be provided for the read reset signal RSTR.

As explained above, according to the present invention, since an effective timing of the write reset signal RSTW coincides with that of the read reset signal RSTR within the one-chip FIFO memory device, a design for adjusting these timings becomes unnecessary, and thus the manufacturing cost is reduced.

We claim:

1. A one-chip first-in first-out memory device comprising:
   a memory cell array;
   a write address generating means for generating a write address by counting a clock signal, said write address generating means being reset by a write reset signal;
   a write means, connected to said memory cell array and said write address generating means, for writing data into a portion of said memory cell array indicated by said write address;
   a read address generating means for generating a read address by counting said clock signal, said read address generating means being reset by a read reset signal;
   a read means connected to said memory cell array and said read address generating means, for read data from a portion of said memory cell array indicated by said read address; and
   a delay circuit, connected to one of said write address generating means and said read address generating means, for coinciding an effective timing of said write reset signal with that of said read reset signal.

2. A device as set forth in claim 1, further comprising a write enable signal generating means, connected to said write address generating means and said write means, said write enable signal means for generating a write enable signal in accordance with said write reset signal, said write enable signal also for transmitting said write enable signal to said write means.

3. A device as set forth in claim 1, wherein said write address generating means comprises:
   a write counter for counting said clock signal, said write counter being cleared by said write reset signal; and
   a write address generating circuit, connected to said write counter, for counting a carry-out signal of said write counter to generate said write address.

4. A device as set forth in claim 3, wherein said write means comprises:
   shift register means for receiving input data in response to said clock signal; and
   a write decoder, connected to said write address generating means, for decoding said write address to select one row of said memory cell array, to thereby write data of said shift register means thereto.

5. A device as set forth in claim 4, wherein said shift register means comprises:
   two shift registers; and
   a switch circuit connected to said write counter and said two shift registers, for alternately enabling said two shift registers to receive said input data.

6. A device as set forth in claim 1, wherein said read address generating means comprises:
   a read counter for counting said clock signal, said read counter being cleared by said read reset signal; and
   a read address generating circuit, connected to said read counter, for counting a carry-out signal of said read counter to generate said read address.

7. A device as set forth in claim 6, wherein said read means comprises:
   shift register means for receiving output data from said memory cell array in response to said clock signal; and
   a read decoder, connected to said read address generating means, for decoding said read address to select one row of said memory cell array, to thereby write data therefrom to said shift register means.

8. A device as set forth in claim 7, wherein said shift register means comprises:
   two shift registers; and
   a switch circuit connected to said read counter and said two shift registers, for alternately enabling said two shift registers to receive data from said memory cell array.

9. A device as set forth in claim 1, wherein said delay circuit comprises a series of D flip-flops for receiving said write reset signal, said D flip-flops being clocked by said clock signal.

10. A device as set forth in claim 1, wherein said delay circuit comprises: a n-ary counter for counting said clock signal, said n-ary counter being reset by said write reset signal or said read reset signal.

11. A device as set forth in claim 2, wherein said write enable signal generating means comprises an R-S flip-flop which is reset by said write reset signal and is set by a carry-out signal of said write address generating means.

* * * * *